(12) United States Patent
Kim

(10) Patent No.: US 8,264,873 B2
(45) Date of Patent: Sep. 11, 2012

(54) NON-VOLATILE SEMICONDUCTOR MEMORY CIRCUIT AND METHOD OF CONTROLLING THE SAME

(75) Inventor: Kyu Sung Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 70 days.

(21) Appl. No.: 12/636,894

(22) Filed: Dec. 14, 2009

(65) Prior Publication Data

US 2011/0026319 A1 Feb. 3, 2011

(30) Foreign Application Priority Data

Jul. 29, 2009 (KR) .................. 10-2009-0069608

(51) Int. Cl.
*G11C 11/00* (2006.01)

(52) U.S. Cl. ........................ 365/163; 365/148

(58) Field of Classification Search ................. 365/163, 365/148, 185, 189
See application file for complete search history.

(56) References Cited

U.S. PATENT DOCUMENTS 7,656,710 B1 * 2/2010 Wong ...................... 365/185.19

2009/0043973 A1 2/2009 Kang et al.
2009/0097336 A1 4/2009 Kang et al.
2009/0303785 A1 * 12/2009 Hwang et al. .............. 365/163

FOREIGN PATENT DOCUMENTS

KR 10-0319636 B1 12/2001
KR 10-0470574 B1 1/2005

* cited by examiner

*Primary Examiner* — Hoai V Ho
*Assistant Examiner* — Pablo Huerta
(74) *Attorney, Agent, or Firm* — Ladas & Parry LLP

(57) ABSTRACT

A non-volatile semiconductor memory circuit for use in compensating for time dependent resistive changes in phase change memory cells is presented. The non-volatile semiconductor memory circuit includes a control signal generation unit and a sensing block. The control signal generation unit is configured to provide a control signal having a voltage level corresponding to a read command or a write command. The sensing block is configured to selectively provide a first sensing reference voltage substantially equal to a reference voltage. The sensing block is also configured to selectively provide a second sensing reference voltage which is lower than the reference voltage. The first and second sensing reference voltages are selectively provided as a function of the voltage level of the control signal in which the first and second sensing reference voltages are used to read data of the memory cell array.

9 Claims, 3 Drawing Sheets

NON-VOLATILE SEMICONDUCTOR MEMORY CIRCUIT AND METHOD OF CONTROLLING THE SAME

CROSS-REFERENCES TO RELATED APPLICATION

The present application claims priority under 35 U.S.C. §119(a) to Korean application number 10-2009-0069608, filed on Jul. 29, 2009, in the Korean Intellectual Property Office, which is incorporated herein by reference in its entirety as set forth in full.

BACKGROUND

1. Technical Field

The present invention relates to semiconductor memory circuits, and more particularly, to a non-volatile semiconductor memory circuit of which a write operation is improved, and a method of controlling the same.

2. Related Art

In general, a unit cell of a phase change random access memory (hereinafter, referred to as PCRAM) includes one switching element connected to a word line (for example, a diode) and one variable resistor, such as a GST (Germanium Antimony Telluride GexSbyTez) variable resistor connected to a bit line. The PCRAM can store data in a memory cell by controlling a reversible phase change of the variable resistor GST using an electric pulse.

For example, when a pulse current is applied to a memory cell for a predetermined time, the state of the variable resistor GST can be changed into an amorphous state which can be assigned to a logical reset state). When a pulse current is applied for a longer time than the predetermined time, the state of the variable resistor GST can be changed into a crystalline state which can be assigned to a logical set state.

The amorphous state of the variable resistor GST is not an immediately stabilized state. It exhibits an intrinsic kinetic physical characteristic which is thought to be brought about by relatively slow solid state reorganization mechanisms that are driven by the diffusion of the excess imposed Joule heat. A representative example of this intrinsic kinetic physical characteristic can be seen as a resistance drift as a function of time. The resistance drift refers to a phenomenon in which the resistance of the variable resistor GST increases with time due to various causes. The resistance drift may occur more markedly as the resistance of a material is higher. That is, in the high-resistance state of the variable resistor GST which corresponds to the reset state, the resistance drift becomes markedly more noticeable.

In particular a problem can arise in which a verify read operation for a write operation is performed at an earlier timing than that of a normal read operation. In other words, verification is performed at a point of time when a difference in resistance seems to be large from the resistance of actual target data during the verify read operation. Therefore, it may be difficult to perform correct data determination.

SUMMARY

A non-volatile semiconductor memory circuit of which a write operation is improved is described herein.

A method of controlling a non-volatile semiconductor memory circuit of which a write operation is improved is described herein.

In one embodiment of the present invention, a non-volatile semiconductor memory circuit includes: a memory cell array; a control signal generation unit configured to provide a control signal in response to a read or write command; and a sensing block configured to selectively provide a first sensing reference voltage equal to a reference voltage and a second sensing reference voltage lower than the reference voltage, depending on the level of the control signal, to read data of the memory cell array.

In another embodiment of the present invention, a non-volatile semiconductor memory circuit includes: a memory cell array; a control signal generation unit configured to provide a control signal in response to a read or write command; and a sensing block configured to respond to the level of the control signal to convert a reference voltage into a verification sensing reference voltage having a lower level than that of a sensing reference voltage of a normal read operation. The verification sensing reference voltage during a verify read operation is a voltage which is set on the basis of timing of the verify read operation.

In another embodiment of the present invention, a method of controlling a non-volatile semiconductor memory circuit includes: determining whether a command is a write command or not, and writing data into a corresponding cell; responding to the write command to convert a reference voltage into a verification sensing reference voltage having a different level from a sensing reference voltage of a normal read operation, and performing a verify read operation for the data of the corresponding cell; and determining whether the data of the corresponding cell is data with a target level or not, and applying a write pulse while increasing or decreasing the voltage of the write pulse by a predetermined value.

BRIEF DESCRIPTION OF THE DRAWINGS

Features, aspects, and embodiments are described in conjunction with the attached drawings, in which.

DETAILED DESCRIPTION

Hereinafter, a non-volatile semiconductor memory circuit and a method of controlling the same, according to the present invention, will be described below with reference to the accompanying drawings through preferred embodiments.

Figure 1:
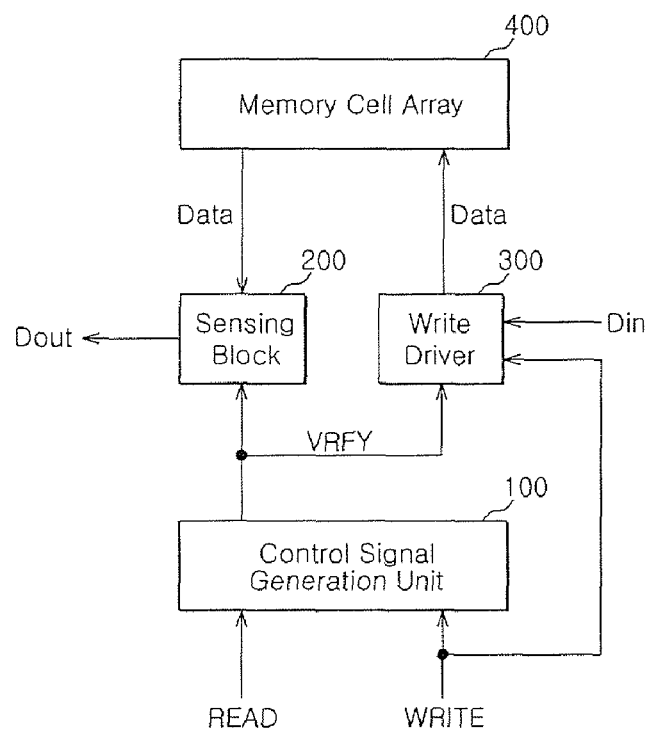
FIG. 1 is a block diagram of a non-volatile semiconductor memory circuit according to one embodiment.

FIG. 1 is a block diagram of a non-volatile semiconductor memory circuit according to one embodiment.

Referring to FIG. 1, the non-volatile semiconductor memory circuit includes a control signal generation unit 100, a sensing block 200, a write driver 300, and a memory cell array 400.

The control signal generation unit 100 provides a verify signal VRFY in response to a read command READ or a write command WRITE.

In this embodiment, a non-volatile semiconductor memory circuit is illustrated, which performs a "verify read operation" when in a write mode. The "verify read operation" refers to an operation of repetitively providing a write pulse in a write mode while verifying whether or not data read from a corresponding cell is identical to that of data to be written. According to this embodiment, the control signal generation unit 100 is configured to provide an activated verify signal VRFY for controlling the "verify read operation" in response to receiving an activated write command WRITE. Furthermore according to this embodiment, the control signal generation unit 100 is configured to provide an inactivated verify signal VRFY in response to receiving an activated read command READ. The inactivated verify signal VRFY provided during the read operation can be used as a signal having substantially the same function as that of a read activation signal in response to receiving a typical read command READ.

The sensing block 200 according to this embodiment is configured to receive the verify signal VRFY to control the read operation so that data is read at different sensing reference voltages depending on a normal read operation and a verify read operation.

That is, the sensing block 200 can include a common sense amplifier (not shown) which performs the normal read operation and the verify read operation required for a write operation, and can sense data at different sensing reference voltages depending on the voltage level of the verify signal VRFY to provide output data Dout. The detailed description of the sensing block 200 will be made below.

The write driver 300 can be a typical write driver which applies a write pulse corresponding to input data Din in response to a write command WRITE. This will be easily understood by those skilled in the art, and thus described simply. The write driver 300 is controlled to apply a write pulse within a predetermined number of times (for example, one to four times) so that data is written into a corresponding PCRAM cell. That is, after the sensing block 200 verifies whether the corresponding data was written or not, the write driver 300 can be controlled to reapply the write pulse in which the amplitude of the write pulse is increased or decreased by a predetermined amount, when the corresponding data was not yet been written in the corresponding PCRAM cell. Although it has been described in this embodiment that the number of predetermined times may be set to one to four, it understood that it is not limited thereof. For example, a larger number of times can be set in a case of writing data in a multi-level cell (MLC).

The memory cell array 400 includes a plurality of PCRAM cells (not shown). Each PCRAM cell may include a switching element (for example, diode) (not shown) connected to a word line (not shown) and one GST variable resistor (not shown) connected to a bit line (not shown). The memory cell array 400 can be controlled by the sensing block 200 so that data of a corresponding cell in the memory cell array 400 is accessed, or controlled by the write driver 300 so that data can be written into the corresponding cell.

Figure 2:
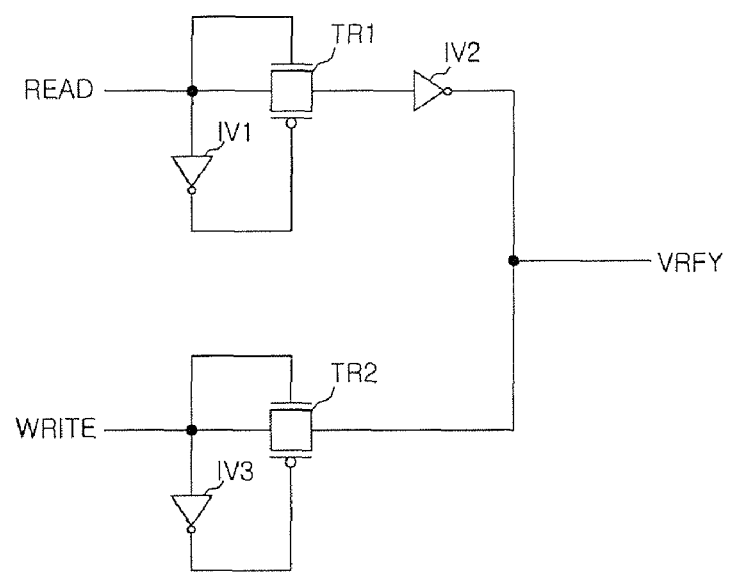
FIG. 2 is a circuit diagram of a control signal generation unit of FIG. 1.

FIG. 2 is one embodiment of a circuit diagram of the control signal generation unit 100 of FIG. 1.

Referring to FIG. 2, the control signal generation unit 100 may include first and second transmission gates TR1 and TR2 and first to third inverters IV1 to IV3.

The first transmission gate TR1 is turned on in response to an activated read command READ.

The second transmission gate TR2 is turned on in response to an activated write command WRITE.

Since it is apparent that the read command READ and the write command WRITE are not simultaneously provided, then the control signal generation unit 100 can be configured to provide a verify signal VRFY for selectively controlling the sensing block 200 in response to an activated read command READ or write command WRITE.

The operation of the control signal generation unit 100 will be described below. First, when the activated read command READ is provided, the first transmission gate TR1 is turned on. As a result, the second inverter IV2 inverts a high-level activated read command READ into a low-level verify signal VRFY.

When the activated write command WRITE is provided, the second transmission gate TR2 is turned on. Then the control signal generation unit 100 provides through the second transmission gate TR2 a high-level activated write command WRITE as a high-level verify signal VRFY.

Although the use of the transmission gates TR1 and TR2 has been described above, it is apparent that a simpler combination of gates may also be used. Such a configuration and simple modification of the circuit does not limit the scope of the embodiment, as long as, the voltage levels of the verify signal VRFY provided therefrom are controlled as a function of the read and write commands (READ and WRITE).

Figure 3:
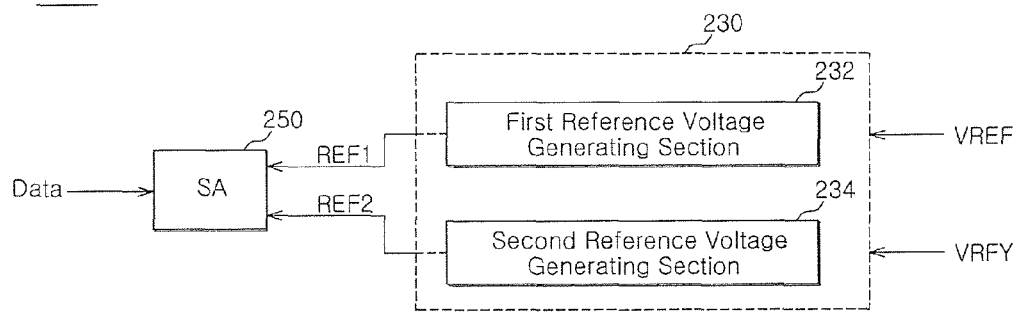
FIG. 3 is a block diagram of a sensing block of FIG. 1 according to one embodiment.

FIG. 3 is a conceptual block diagram of the sensing block 200 of FIG. 1 according to one embodiment.

Referring to FIG. 3, the sensing block 200 may include a sensing reference voltage providing section 230 and a sense amplifier 250. The sensing block 200 is configured to receive the reference voltage VREF to provide first and second sensing reference voltages REF1 and REF2 which respectively have different voltage levels as a function of the voltage level of the verify signal VRFY. The sensing reference voltage providing section 230 includes first and second reference voltage generators 232 and 234.

The sensing reference voltage providing section 230 provides the first and second sensing reference voltages REF1 and REF2 which respectively have different voltage levels that correspond to either the normal read operation or the verify read operation. This differential output of reference voltages REF1 and REF2 is used to compensate for the resistance drift of PCRAM cells. That is, in the case of the normal read operations, the sensing reference voltage providing section 230 receives the sensing reference voltage VREF and a verify signal VRFY at a low-level voltage (also refer to reference numeral 100 of FIG. 1) and outputs a first reference voltage REF1. In contrast during verify read operations, the sensing reference voltage providing section 230 again receives the sensing reference voltage VREF but receives the verify signal VRFY at a high-level voltage (also refer to reference numeral 100 of FIG. 1) and outputs the second reference voltage REF2 in which the voltage level of the second reference voltage REF2 is lower than that of the first reference voltage REF1.

Although it has been described that the sensing reference voltage providing section 230 generates two distinctly different voltage levels corresponding to the reference voltages REF1 and REF2, it is understood herein that the present invention is not limited therein.

Figure 4:
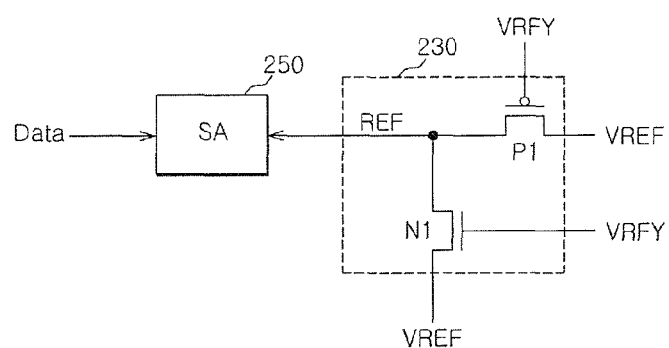
FIG. 4 is a circuit diagram of a sensing block of FIG. 1 according to another embodiment.

FIG. 4 is a circuit diagram of a sensing block 200 of FIG.1 according to another embodiment.

Referring now to FIG. 4, the sensing block 200 may include a sensing reference voltage providing section 230 and a sense amplifier 250 which is similar to that depicted in FIG. 3. That is, the sensing block 200 is configured to receive the reference voltage VREF and the verify signal VRFY to provide a sensing reference voltage REF that has a voltage level which is dependent upon the voltage level of a verify signal VRFY. The sensing can be subsequently performed using these different voltage levels of the sensing reference voltage REF which correspond to the normal read operation and the verify read operation in order to compensate for the resistance drift. Even though the sensing block 200 of FIG. 4 is different from that of FIG. 3 in that the levels of the reference voltages in the normal read operation and the verify read operation are different from each other, a signal having the same name is used.

More specifically, the sensing reference voltage providing section 230 receives a verify signal VRFY and a reference voltage VREF to provide the sensing reference voltage REF which has a voltage level dependent upon the voltage level of the verify signal VRFY.

The first sensing reference voltage providing section 230 may include a first PMOS transistor P1 and a first NMOS transistor N1.

The first PMOS transistor P1 has a gate configured to receive the verify signal VRFY, a source configured to be connected to the reference voltage VREF, and a drain configured to provide a sensing reference voltage REF.

The first NMOS transistor N1 has a gate configured to receive the verify signal VRFY, a source configured to be connected to the reference voltage VREF, and a drain configured to provide a sensing reference voltage REF.

According to this embodiment, the resistance of the first NMOS transistor N1 is preferably set to be larger than that of the first PMOS transistor.

The sense amplifier 250 senses and amplifies the level of data of a corresponding cell using the sensing reference voltage REF.

The operation of the sensing block 200 will be now described.

First, when a low-level verify signal VRFY is provided, the first PMOS transistor P1 is turned on in response to the low-level verify signal VRFY, and the first NMOS transistor N1 is turned off in response to the low-level verify signal VRFY. Therefore, the sensing reference voltage REF may be provided through the first PMOS transistor P1. At this time, the level of the sensing reference voltage REF is substantially the same as that of the reference voltage VREF. For convenience of description, this level is referred to as a first voltage level.

On the other hand, when a high-level verify signal VRFY is provided, the first PMOS transistor is turned off in response to the high-level verify signal VRFY, and the first NMOS transistor is turned on in response to the high-level verify signal VRFY. In this case, the sensing reference voltage REF can be provided through the first NMOS transistor N1. However, the sensing reference voltage REF becomes a signal having a lower voltage level than that of the signal passing through the first PMOS transistor P1. This level may be referred to as a second voltage level. As described above, the first PMOS transistor P1 and the first NMOS transistor N1 are preferably provided to have different resistances. Therefore, the drivability of the first NMOS transistor N1 becomes smaller than that of the first PMOS transistor P1. Accordingly, although the same reference voltage VREF is applied as a source voltage, the first PMOS transistor P1 and the first NMOS transistor N1 can provide sensing reference voltages REF with distinctly different voltage levels due to a difference in drivability brought about by this resistance ratio.

In the case of the normal read operation, a low-level verify signal VRFY is generated (refer to reference numeral 100 of FIG. 2) to use a sensing reference voltage REF having the same voltage level as that of the reference voltage VREF. However in the case of the verify read operation a high-level verify signal VRFY is generated (refer to reference numeral 100 of FIG. 2) to generate a sensing reference voltage REF having a lower level than in the normal read operation.

During a typical verify read operation, a write pulse for target data is applied to a corresponding cell to perform the verify read operation immediately after a write operation. This is a different operation from that of the normal read operation which is performed in response to a new read command after a write operation is performed in response to a write command. In the latter case, since a new read operation is performed by a controller (not shown) after the write operation, it may take several milliseconds (ms) to perform the read operation after the write operation. However in the case of the verify read operation a control signal for the verify read operation is already provided at the same time when a write command is applied. Therefore, it takes several hundred ms to perform the verify read operation after the write operation. In the related art, the verify read operation is performed using the same sensing reference voltage as that of a normal read operation at a point of time when it is too early to make an accurate determination while the resistance of the corresponding cell changes. In this case in the related art, a determination error may occur, in which it is determined that data was not exactly written even though the resistance is increasing due to this intrinsic characteristic brought about by the slower kinetics of reaching a stable resistance in amorphous phase change material. Therefore, in the related art an unnecessary write operation may be added which necessarily increases the time of the write operations in the related art.

However in this present invention the sensing in the verify read operation is performed using the sensing reference voltage REF at the second voltage level for compensating for this intrinsic resistance drift which aids in protecting against such a verification error. As a result, the present invention can realize a reduction in the determination errors of data. The voltage level of the sensing reference voltage REF required for the verify read operation can be calculated by analyzing a resistance increase which is characteristic of the particular phase change material. This will be described in detail with reference to FIG. 5.

Figure 5:
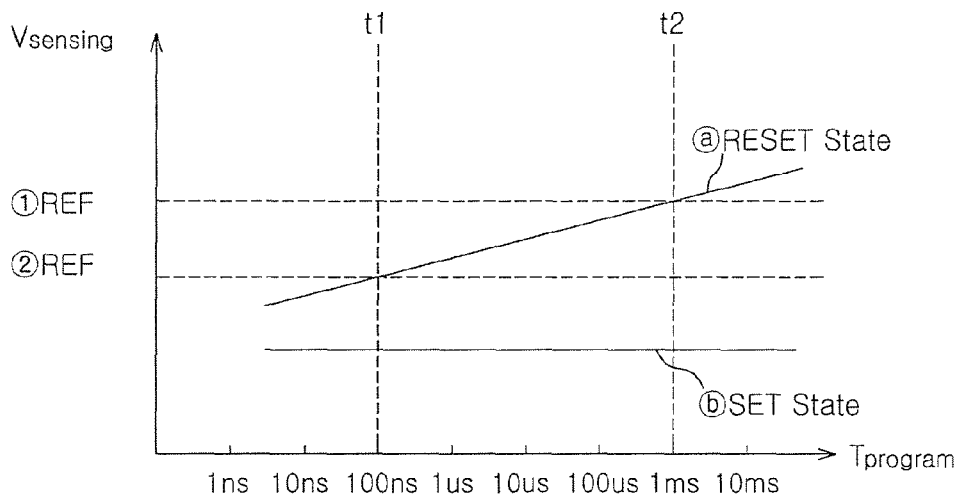
FIG. 5 is a graph showing the relationship between sensing reference voltages REF in a normal read operation and a verify read operation in FIG. 1.

FIG. 5 is a graph showing the time dependent relationship between the sensing reference voltages REF in the normal read operation and the verify read operation in FIG. 1.

In FIG. 5, the X-axis indicates a write (or program) time in a logarithmic scale, and the Y-axis indicates a voltage level of sensed data. Furthermore, reference symbol ⓐ represents resistance of data in the reset state, and reference symbol ⓑ represents resistance of data in the set state.

As can be seen in FIG. 5, the resistance data corresponding to the set state is relatively constant as a function of time, but the resistance data corresponding to the reset state gradually increases with time.

Time t1 represents a time at which an actual verify read operation is performed during the write mode.

Time t2 represents a time at which a normal read operation performed in response to a read command is performed.

In this embodiment, a voltage at the time t2 where the normal read operation is performed is used as a first-level sensing reference voltage ①REF, and a voltage at the time t1 where the verify read operation is performed is used as a second-level sensing reference voltage ②REF.

In the related art, the resistance drift is not compensated, and one sensing reference voltage (for example, ①REF) is used to perform sensing during both of the verify read operation and the normal read operation.

In this present invention, however, the data verification is performed using a second-level sensing reference voltage ②REF during the verify read operation. Therefore unnecessary write pulses can be suppressed from being additionally provided. In other words, even though the level of data sensed immediately after a write operation was low, the level approaches the level of the target data after a predetermined time passes. However in the related art since the data is verified using an extremely high sensing reference voltage (for example, ①REF) at a point of time where the state of the data is unstable, an additional write pulse is likely to be repeatedly provided. However in the present invention the new sensing reference voltage ②REF corresponds to a voltage at the time when the verify read operation is provided by compensating for the verify read time is performed earlier than that of the related art. By compensating for the kinetics associated with this intrinsic resistance drift of data, then the level of the resistance, i.e., data, eventually arrives at the target resistance level due to the resistance drift even after the verify read time. Therefore, the present invention can realize a possible reduction in the write times. Furthermore, a high-voltage pulse can be avoided from being repeatedly applied at the PCRAM cells which makes it possible to protect or at least inhibit the PCRAM cells from aging.

Figure 6:
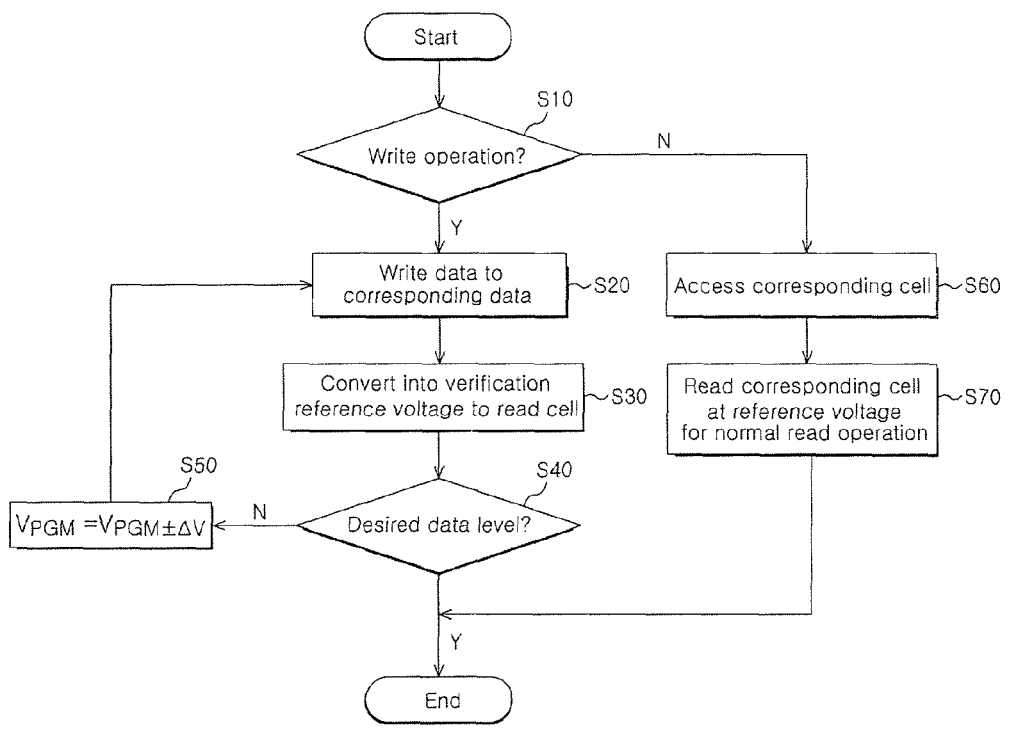
FIG. 6 is a flowchart showing a method of controlling the non-volatile semiconductor memory circuit of FIG. 1.

FIG. 6 is a flowchart showing a method of controlling the non-volatile semiconductor memory circuit of FIG. 1.

Referring to FIGS. 1 through 5, first it is determined whether or not an operation is a write operation (S10).

When it is determined that the operation is a write operation, data is written to a corresponding cell (S20).

Simultaneously, the control signal generation unit 100 provides a verify signal VRFY having an activated level in response to the write command.

The sensing block 200 converts into a verification reference voltage at the second voltage level, and subsequently reads the data of the corresponding cell (S30).

That is, a sensing reference voltage at a previously-calculated verify read time is provided, and the data is read in accordance with the sensing reference voltage.

Then it is determined whether or not the level of the read data corresponds to that of the target data (S40). When it is determined that the level does not correspond to that of the target data, then the amplitude of a write pulse is increased or decreased by a predetermined value (S50). The write and verify operations are repeated until the desired level is written to the corresponding cell (S20 to S50).

When it is determined at step S10 that the operation is not a write operation, a corresponding cell is accessed (S60) to perform a normal read operation.

During the normal read operation, the corresponding cell is read using a reference voltage for the normal read operation (S70).

According to the embodiment, although the normal read operation and the verify read operation are performed by the common sense amplifier, sensing reference voltages having different voltage levels are generated using the same reference voltage and then used. Therefore, the resistance drift is compensated when performing the verify read operations. Accordingly, since the write operation time can be reduced, it is possible to provide a high-speed non-volatile semiconductor memory circuit.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A non-volatile semiconductor memory circuit coupled to a memory cell array, the non-volatile semiconductor memory circuit comprising:
    a control signal generation unit configured to provide a control signal in response to a read command or a write command; and
    a sensing block configured to include a sensing reference voltage providing section receiving a reference voltage, generate a second sensing reference voltage by transmitting the reference voltage when the control signal is enabled, or a first sensing reference voltage which is lower than the reference voltage when the control signal is disabled, selectively provide one of the reference voltage as a first sensing reference voltage and the reference voltage as a second sensing reference voltage to the sense amplifier, wherein the first and second sensing reference voltages are used to read data of the memory cell array, and the sensing block comprises a sensing reference voltage providing section configured to provide the first sensing reference voltage during a normal read operation and the second sensing reference voltage during a verify read operation.

2. The non-volatile semiconductor memory circuit according to claim 1, wherein the second sensing reference voltage has a voltage level lower than that of the first sensing reference voltage.

3. The non-volatile semiconductor memory circuit according to claim 1, wherein the control signal generation unit provides the control signal in an inactivated state in response to the read command and the control signal generation unit provides the control signal in an activated state in response to the write command.

4. The non-volatile semiconductor memory circuit according to claim 1, wherein the sensing reference voltage providing section comprises:
    a first switching element configured to provide the first sensing reference voltage to the sense amplifier in response to the reference voltage and a first voltage level of the control signal; and
    a second switching element configured to provide the second sensing reference voltage to the sense amplifier in response to the reference voltage and a second voltage level of the control signal.

5. The non-volatile semiconductor memory circuit according to claim 4, wherein the first switching element has a larger resistance than that of the second switching element.

6. The non-volatile semiconductor memory circuit according to claim 1,
    wherein the sensing reference voltage is provided by drivabilities of transistors which are included in the sensing reference voltage providing section, and
    the drivabilities of the transistors are decided by a resistance ratio of the transistors.

7. A non-volatile semiconductor memory circuit coupled to a memory cell array, the non-volatile semiconductor memory circuit comprising:
    a control signal generation unit configured to provide a control signal in response to a read command or a write command; and
    a sensing block configured to respond to a voltage level of the control signal to convert a reference voltage into a verification sensing reference voltage wherein the verification sensing reference voltage is configured to selectively generate one of the reference voltage as a first sensing reference voltage which is lower than the reference voltage when control signal is disabled and a second sensing reference voltage by transmitting the received reference voltage when control signal enabled.

8. The non-volatile semiconductor memory circuit according to claim 7, wherein the control signal generation unit provides the control signal in an inactivated state in response to the read command and the control signal in an activated state in response to the write command.

9. The non-volatile semiconductor memory circuit according to claim 7, wherein the sensing block provides the sensing reference voltage at a voltage level substantially the same as that of the reference voltage when the control signal is at a first voltage level, and the sensing block provides the sensing reference voltage at a voltage level less than the reference voltage when the control signal is at second voltage level.

* * * * *